United States Patent [19]
Whetsel

[11] Patent Number: 5,610,530
[45] Date of Patent: Mar. 11, 1997

[54] ANALOG INTERCONNECT TESTING

[75] Inventor: Lee D. Whetsel, Plano, Tex.

[73] Assignee: Texas Instruments Incorporated, Dallas, Tex.

[21] Appl. No.: 568,705

[22] Filed: Dec. 7, 1995

Related U.S. Application Data

[63] Continuation of Ser. No. 329,583, Oct. 26, 1994, abandoned.

[51] Int. Cl.⁶ .................................................. G01R 31/28
[52] U.S. Cl. ..................... 324/763; 324/73.1; 324/755; 324/158.1; 371/28; 371/25.1; 371/22.5
[58] Field of Search ........................... 324/66, 73.1, 763, 324/158.1, 765, 755; 371/25.1, 28, 22.5

[56] References Cited

U.S. PATENT DOCUMENTS

| | | | |
|---|---|---|---|
| 3,867,693 | 2/1975 | Saxenmeyer | 324/756 |
| 4,298,969 | 11/1981 | Rickenbacker | 324/523 |
| 4,339,400 | 8/1983 | Rockwell | 324/66 |
| 4,446,421 | 5/1984 | Berde | 324/523 |
| 4,578,636 | 3/1986 | Bakke | 324/66 |
| 4,651,084 | 3/1987 | Welsh | 324/523 |
| 4,996,487 | 2/1991 | McSparran | 324/523 |
| 5,418,470 | 5/1995 | Dagostino | 324/763 |

OTHER PUBLICATIONS

K. P. Parker, J. E. McDermid and S. Oresjo, "Structure and Metrology for and analog Testability Bus", IEEE 1993, International Test Conference, Paper 15.2, pp. 309–317 [Oct. 17–21, 1993].

M. Jarwala, S. Tsai, "A Framework for Design for Testability of Mixed Analog/Digital Circuits", IEEE 1991, Custom Integrated Circuits Conference, Paper 13.5 pp. 1–4.

*Primary Examiner*—Kenneth A. Wieder
*Assistant Examiner*—Jose M. Solis
*Attorney, Agent, or Firm*—Scott B. Stahl; Leo N. Heiting; Richard L. Donaldson

[57] ABSTRACT

A boundary scan interface structure (R1, R2, R3) connected between a first terminal (101) of a first analog circuit and a second terminal (103) of a second analog circuit is evaluated by selecting a test voltage to be applied to the first terminal, determining an expected voltage that is expected to be produced at the second terminal in response to application of the test voltage to the first terminal, selecting a reference voltage (REF) as a function of the expected voltage, applying the test voltage to the first terminal to produce a response voltage at the second terminal, and comparing the response voltage to the reference voltage.

5 Claims, 6 Drawing Sheets

ANALOG INTERCONNECT TESTING

CROSS-REFERENCE TO RELATED APPLICATIONS

This application is a Continuation of application Ser. No. 08/329,583, filed Oct. 26, 1994 now abandoned.

The subject matter of the present application is related to subject matter disclosed in the following copending, co-assigned U.S. patent applications which are incorporated herein by reference:

| Docket | PTO Reference | Effective Filing Date |
| --- | --- | --- |
| TI-18463 | Ser. No. 08/383,537 | 8/17/93 (now abandoned) |
| TI-19961 | Ser. No. 08/329,581 | (now abandoned) |

FIELD OF THE INVENTION

The present invention relates to testing electrical circuitry and, more particularly, to testing electrical circuitry including analog and/or mixed signal integrated circuits.

BACKGROUND OF THE INVENTION

Presently an analog test standard (IEEE P1149.4) is in development to provide the electronics industry with analog test circuitry at input and output pins of analog and mixed signal integrated circuits. The test circuitry is intended to allow scan access of analog pins for the purpose of: (1) providing a means of verifying pin to pin interconnect, and (2) to provide a means for measuring elements found within the pin to pin interconnect, such as resistors, inductors, capacitors, diodes, transistors, or combinations of these elements forming more complex pin to pin networks. Prior art relating to the P1149.4 standard is depicted in a paper published at the 1993 International Test Conference entitled "Structure and Metrology For an Analog Testability Bus" by Parker.

FIG. 1 illustrates the prior art analog cells placed at the output pin 101 of IC1 and at the input pin 103 of IC2. The output pin of IC1 is connected to the input pin of IC2 via an interconnect comprising a series resistor R1. The input and output analog cells comprise scan operated switches 105, 107, 109 and 111 for closing the pin interconnect to Vmax (+15), Vmin (ground (G)), analog bus 1 (AB1) pin, and analog bus 2 (AB2) pin, respectively. In addition, the cells comprise a core disconnect (CD) capability for isolating the IC1 and IC2 core logic from the pin interconnect during testing, and a digital receiver (DR) which allows digitization of analog signals passed between IC1 and IC2 pins during test. The DR operates to receive the pin voltage, compare the voltage to a voltage threshold (Vt), and output a logic one ff the pin voltage is greater than Vt, or a logic zero if the pin voltage is less than Vt. The value of Vt is internally fixed inside each IC at approximately the midpoint voltage between Vmax and Vmin, say ½(Vmax–Vmin). These prior art analog cells and their operation are described in detail in the Parker paper.

The test cells can be made to operate in two test modes, digital test mode and analog test mode. During digital test mode, the Vmax and Vmin cell switches 105 and 107 are operated to transmit logic levels (in this case +15 and G voltage swings) from IC pin 101, through the resistive interconnect R1, to be received and digitized to a logic 1 or 0 by the DR at the IC pin 103. Thus the digital test mode uses the Vmax, Vmin, and DR portions of the cells. The digital test mode is modelled after the operation of an existing standard for boundary scan testing, IEEE 1149.1. During analog test mode, the AB1 and AB2 switches 109 and 111 are operated to connect the resistive interconnect to an external test resource. For example the AB1 pin of IC1 could connect IC1's pin 101 to an external signal source and the AB2 pin of IC2 could connect IC2's pin 103 to an external signal monitor. In this arrangement, the external signal source at AB1 can input a signal to the pin of IC1, pass the signal through the resistive interconnect between IC1 and IC2 to be output to the external signal monitor via the AB2 pin of IC2.

The analog test mode can also measure the value of R1 using guarding techniques. The guarding technique uses either the Vmin or Vmax switch 105 or 107 in combination with the AB1 and AB2 switches 109 and 111. During guarding, the Vmin or Vmax switch 105 or 107 is closed to place a known voltage reference on the pin 103 of IC2. With a known voltage reference, say Vmin (G), placed on the IC2 pin 103, a known current can be injected at IC1's AB1 pin to flow from IC1's interconnect pin 101, through R1, and into the pin 103 of IC2. The voltage drop across R1 can then be determined by taking voltage readings at the IC2 pin 103 (using AB2), then at the IC1 pin (again using AB2), then dividing the voltage difference by the known current injected at AB1 of IC1. The external test resource provides a high input impedance at the AB2 pins, so almost zero current flows between the test resource and the AB2 pins. With almost zero current flow, the voltage drop across the AB2 switches 111 is approximately zero, resulting in the voltage reading at the AB2 pins being approximately equal to the voltage present across R1 at the pins 101 and 103 of IC1 and IC2. Guarding measurement techniques are well know by those skilled in the art of testing. The way guarding is utilized in the prior art test cell of FIG. 1 for more complex interconnect networks is explained in detail in the Parker paper, but the basic guarding concept has been described here.

In FIG. 1, it is seen that a short which electrically bypasses R1 could occur during assembly of the circuit. The digital test mode can't detect the short since the test is based on the transfer of logic levels. However, the analog test mode, using the measurement technique, can. Thus, while the digital test mode is the fastest test method to verify an interconnect, the analog test mode is the only one that can analyze the network to prove the resistor is in the interconnect and is correct in value. The following problems are identified with respect to the prior art test cell.

One problem with the arrangement of switches in the prior art test cell, as identified in the present work, is illustrated in FIG. 2. The problem arises because not all interconnected ICs will have the same supply voltages. In the FIG. 2, IC1 is supplied by +15 and –15 volt supplies, while IC2 is supplied by +5 and –5 volt supplies. R1 in the interconnect serves as a current limiter so that unexpectedly high voltage levels from IC1 cannot damage IC2. During normal (not test) operation, the core logic of IC1 is designed to output electrically safe voltage levels to IC2. However, during test mode (both analog and digital test modes) the core logic is isolated (by the CD) from the pin 101 of IC1 and the Vmax and Vmin switches 105 and 107 are operated to generate the voltages output to IC2. In FIG. 2 it is seen that in test mode, Vmax and Vmin switches 105 and 107 cause +15 and –15 volt swings to be output from IC1 at 101. If R1 is in the path, IC2 will probably not be damaged by these voltage output swings since R1 serves to limit the current flow into IC2. However if a short occurs that electrically bypasses R1, IC2 could be subjected to the full +15 and −15 volt swings outputs from IC1 and the resulting high current flows.

The protection diodes at IC pins are designed to clamp input voltages from exceeding the IC's supply voltages. The upper protection diode D1 of IC2 clamps the input pin voltage so that it never becomes more positive than the +5 volt supply plus the diode voltage drop, approximately +5.06 volts. The bottom protection diode D2 of IC2 clamps the input pin voltage so that it never becomes more negative than the −5 volt supply plus the diode voltage drop, approximately −5.06 volts. Protection diodes such as D1 and D2 are designed to protect ICs from transient voltage spikes that may occur in system operation. They are not designed to clamp sustained large voltage levels for long periods of time.

In the event that the short exists across R1 (as shown by dotted lines), the upper protection diode D1 at the pin 103 of IC2 is driven hard into forward bias by the 10 volt difference between the +15 volt supply of IC1 and the +5 volt supply of IC2. For example, when IC1 outputs +15 volts via the Vmax switch 105, a large current flows from IC1's +15 volt supply, out of the IC1 pin 101, through the short across R1 to the pin 103 of IC2, through the upper forward biased protection diode D1 of the IC2 pin 103, and to the +5 volt supply of IC2. Also, when −15 volts is output from IC1, the bottom protection diode D2 at the pin 103 of IC2 is driven hard into forward bias by the 10 volt difference between the −5 volt supply of IC2 and the −15 volt supply of IC1. Again, when IC1 outputs −15 volts via the Vmin switch 107, a large current flows from IC2's −5 volt supply, through the bottom forward biased protection diode D2 of IC2, out of the IC2 pin 103, through the short across R1 to the pin 101 of IC1, and to the −15 volt supply of IC1. The results of these large, sustained current flows through the short during test mode can result in the destruction of the protection diodes or even IC2. Although FIG. 2 shows one example of the problem with ICs having unbalanced supply voltages, it should be understood that large test voltages output from IC1 could be connected to other devices (power transistors, SCRs, motor controllers, etc) that also may be damaged or cause damage in other devices.

The size of analog test cells and the load they place on input and output pin signals is a concern to mixed signal and analog IC designers. One example test cell that has been discussed within the P1149.4 standard working group is shown in FIG. 11. This cell is similar to the prior art cell of FIG. 1, with the exception that the Vmax switch 105 is removed for the purpose of reducing the cell's size and to eliminate one switch load from being connected to the signal line 1101 during normal (non-test) operation. The cell of FIG. 11 allows the AB1 or AB2 switch 109 or 111 to function in place of the removed Vmax switch 105 during digital test mode. For example, during digital test mode an external voltage can be input on the AB1 or AB2 pin and the respective AB1 or AB2 switch 109 or 111 operated to provide the voltage output previously provided by the Vmax switch 105 of the cell in FIG. 1.

While the test cell of FIG. 11 does achieve a reduced size and load test cell, it does not address the problems identified. For example, while the cell allows the high voltage level of the voltage swing during digital testing to be supplied from an AB pin and switch, the low voltage level of the voltage swing is still supplied by the internal Vmin switch 107. Thus when IC1 and IC2 are supplied by unmatched supply voltages, as shown in FIG. 11, the bottom diode D2 of IC2 is still subjected to damaging high current flows as previously described.

Another problem with the prior art test cell, as identified in the present work, involves how the voltage threshold (Vt) for the DR is developed. As previously described, the DR receives voltage input from the IC pin and converts it into logic levels that can be scanned out for inspection by comparing the pin voltage to Vt. If the pin voltage is above Vt, a logic one is produced by the DR. If the pin voltage is below Vt, a logic zero is produced by the DR. The prior art cell establishes the value of Vt internal to the IC and places it at around ½ the voltage difference between the IC's Vmax and Vmin voltages.

The problem with establishing a fixed Vt internal to the IC is that it cannot be universally used to determine whether a voltage at a pin is a logic one or a logic zero. FIG. 3 illustrates IC1 connected to IC2 via a resistive network comprising resistors R1, R2 and R3. In this example, R2=R3, and R1=2×R2. The resistors form a voltage divider network between IC1 and IC2, causing the voltage level input to the receiving IC to be ⅓ the voltage level output from the transmitting IC, i.e. IC2 voltage input=IC1 voltage output times R3/(R1+R3), or, in the opposite direction, IC1 voltage input=IC2 voltage output times R2/(R1+R2). In digital test mode, if IC1 outputs +15 volt (Vmax) and·G (Vmin) voltage swings to IC2, IC2 will receive +5 volt and G swings at its pin 103 due to the voltage division by R1 and R3. Since the Vt of IC2 is fixed close to the mid-point between its Vmax and Vmin supplies (say 7.5 volts), its DR interprets both the +5 volt and G inputs as being a logic zero. Thus, in the example arrangement of FIG. 3, the digital test mode of the prior art cell is not able to pass a recognizable logic one from IC1 to IC2 due to the voltage divider in the pin to pin interconnect.

While the example in FIG. 3 shows an interconnect that prevents logic ones from being output from IC1 and recognized at IC2, it should be clear that other examples could show how logic zeros could be prevented from being output from IC1 and recognized at IC2. For example in FIG. 4, simply connecting R2 and R3 to +15 volts instead of G and leaving all other connections the same as in FIG. 3 illustrates an interconnect where a logic zero from IC1 is not recognizable by IC2. In digital test mode, IC1 outputs +15 volt logic one and G logic zero voltage swings to IC2. However due to the voltage divider of R1 and R3, IC2 only receives +15 volt and +10 volt (15 V×⅔) swings at its pin 103. Since the Vt of IC2 is fixed at approximately 7.5 volts, its DR interprets both the +15 and +10 volt inputs as being a logic one. Thus, in the example arrangement of FIG. 4, the digital test mode of the prior art cell is not able to pass a recognizable logic zero from IC1 to IC2 due to the voltage divider in the pin to pin interconnect.

To overcome the above-described problems, a need has arisen for a new analog test cell. A new analog test cell architecture according to the present invention eliminates the Vmax and Vmin switches of the prior art cells which provided connection of the IC's pin to the supply voltage rails of the IC. The new cell architecture eliminates the internally produced Vt for the DR which determined the reference voltage for recognizing logic one and zero voltage levels at the IC's pin. The new cell adds a guard switch which allows connecting the IC pin to an externally supplied reference voltage. The external reference voltage for the cell's guard switch is provided by the addition of an IC pin referred to as a reference pin. The new cell also connects the reference pin up to the DR to provide an externally supplied and regulated Vt level for use during the digital test mode.

DETAILED DESCRIPTION

Figure 5:
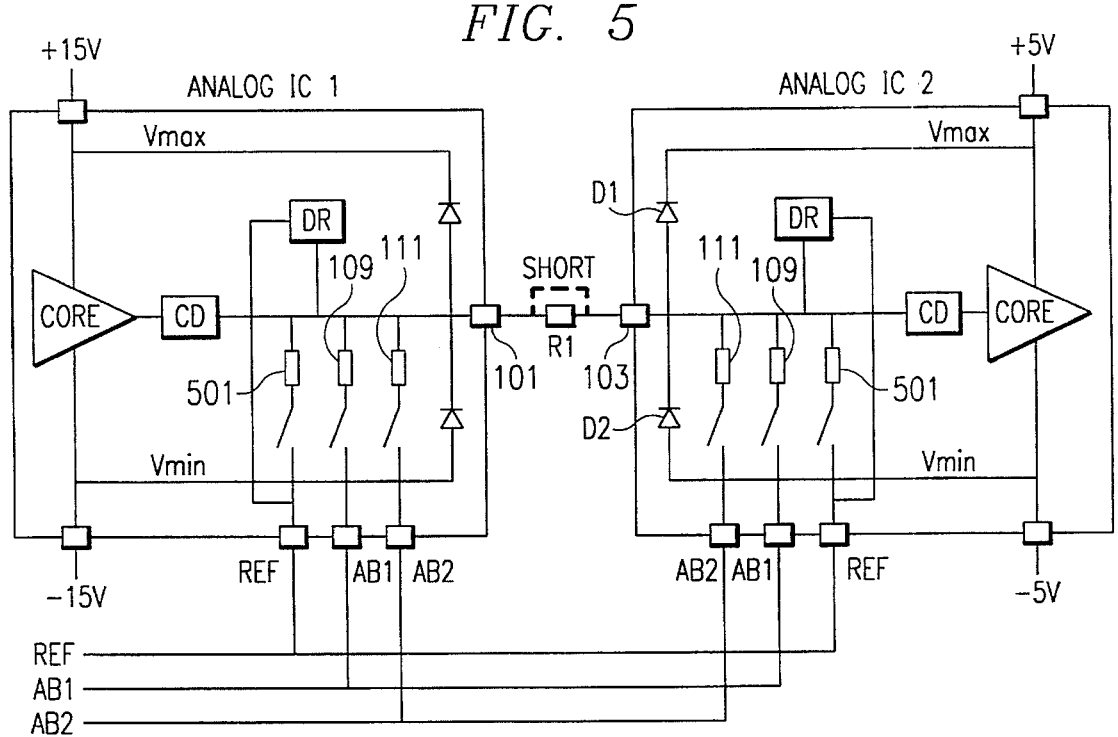
FIGS. 5–7 illustrate how analog test cells according to the present invention overcome the problems associated with the prior art analog test cells.

An exemplary analog test cell structure of the present invention is shown implemented in IC1 and in IC2 of FIG. 5. In IC1, the test cell is interposed between the core and output pin 101, and in IC2 the test cell is interposed between the core and input pin 103. In FIG. 5, IC1 is supplied by +15 and −15 volt supplies and IC2 is supplied by +5 and −5 volt supplies. Also the pins of IC1 and IC2 are connected through a series resistor R1.

The prior art cells are designed to output, during digital test mode, predetermined Vmax and Vmin voltage levels that are directly related to the ICs supply voltage levels. The new cell design eliminates this use of Vmax and Vmin levels by allowing the output voltage levels to be externally supplied at IC pins AB1 and AB2, not from the IC voltage supplies. In the digital test mode, the new cell allows safely controlled voltage levels to be externally supplied to produce the logic one and logic zero transfers between IC1 and IC2. For example, when transferring logic levels from IC1 to IC2 in FIG. 5, a +5 volt level can be supplied to the AB1 pin of IC1 and a −5 volt level can be supplied to the AB2 pin of IC1. Operating the opening and closing of AB1 and AB2 switches 109 and 111 via scan control will cause +5 volt (logic one) and −5 volt (logic zero) levels to be output from the IC1 pin 101. These levels pass through the resistive interconnect of FIG. 5 to be input to IC2. If a short exists, as shown in dotted lines, the voltage levels received by IC2 will be within a safe range of voltages (+5 and −5 volts) for the voltage supplies of IC2 (+5 and −5 volts) so that they will not damage the pin protection diodes D1 and D2 of IC2. Thus, whereas the prior art cells produced logic level outputs based on the supply voltages of the IC (Vmax and Vmin), the new cell produces logic level outputs based on safe voltage levels supplied to the AB1 and AB2 pins from an external source. Therefore the new cell can be safely used in circuits where analog ICs may be supplied by varying supply voltage levels.

The prior art cells are designed to provide, during digital test mode, an internally fixed Vt to the DR for use in converting voltage levels received at IC pins into logic ones and zeros. The problem with a fixed Vt is that elements found within the pin to pin interconnect can cause voltage level shifting which prevents a receiving IC from recognizing transmitted voltage levels as being logic ones or zeros. The new cell design eliminates the use of an internally fixed Vt by providing an additional pin (REF) that is used to supply an externally programmed Vt to the cell's DR.

Figure 3:
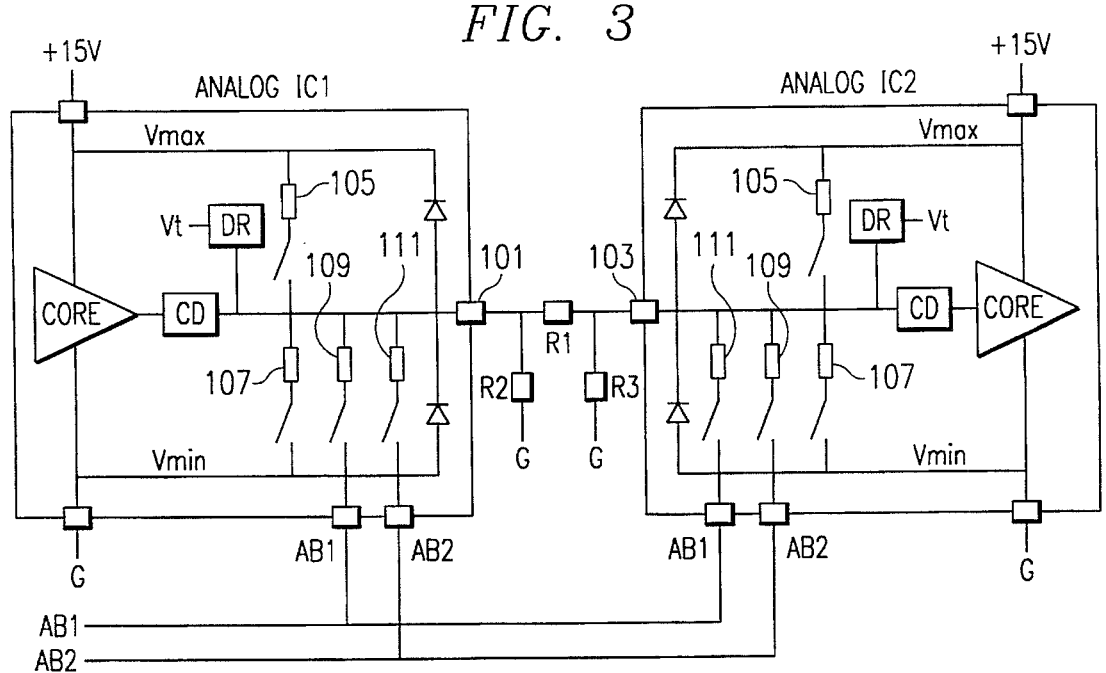
Figure 6:
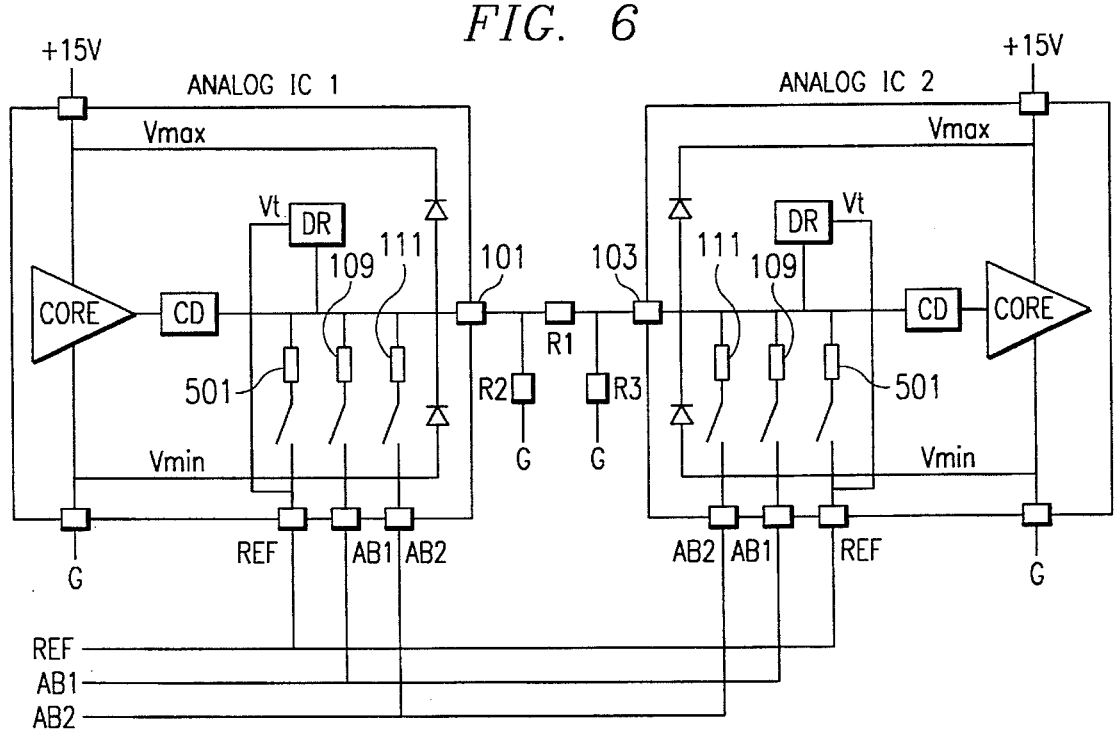

In exemplary FIG. 6, IC1 and IC2 are each shown implementing the new cell. Both ICs are supplied by +15 volts and G, and their pins are connected via the same resistive interconnect described in FIG. 3, with R2=R3 and R1=2R2. The resistive interconnect provides a voltage divider between the pins of IC1 and IC2. During digital test mode, the AB1 and AB2 pins supply the voltage levels to be transferred between IC1 and IC2 through the resistive interconnect, and the REF pin supplies the Vt level for the cell's DR. If the AB1 and AB2 pins of IC1 are supplied respectively with +15 volts and G and the AB1 and AB2 switches 109 and 111 are operated to produce +15 and G voltage swings from IC1, the resistive interconnect will produce 5 volt (15 V×(⅓)) and G swings at the input pin 103 of IC2, due to the voltage division of R1 and R3. Since Vt must be set to recognize a logic one (+5 v) from a logic zero (G) at the input 103 of IC2, a voltage of say +2.5 v is supplied to the REF pins of IC1 and IC2.

Figure 4:
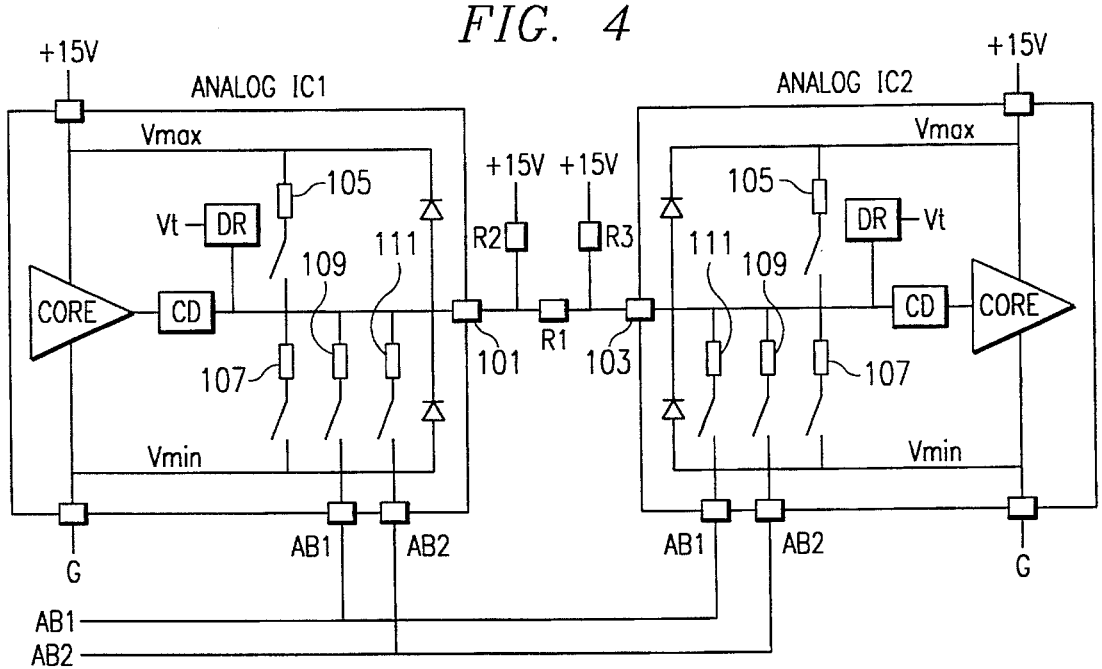
Figure 7:
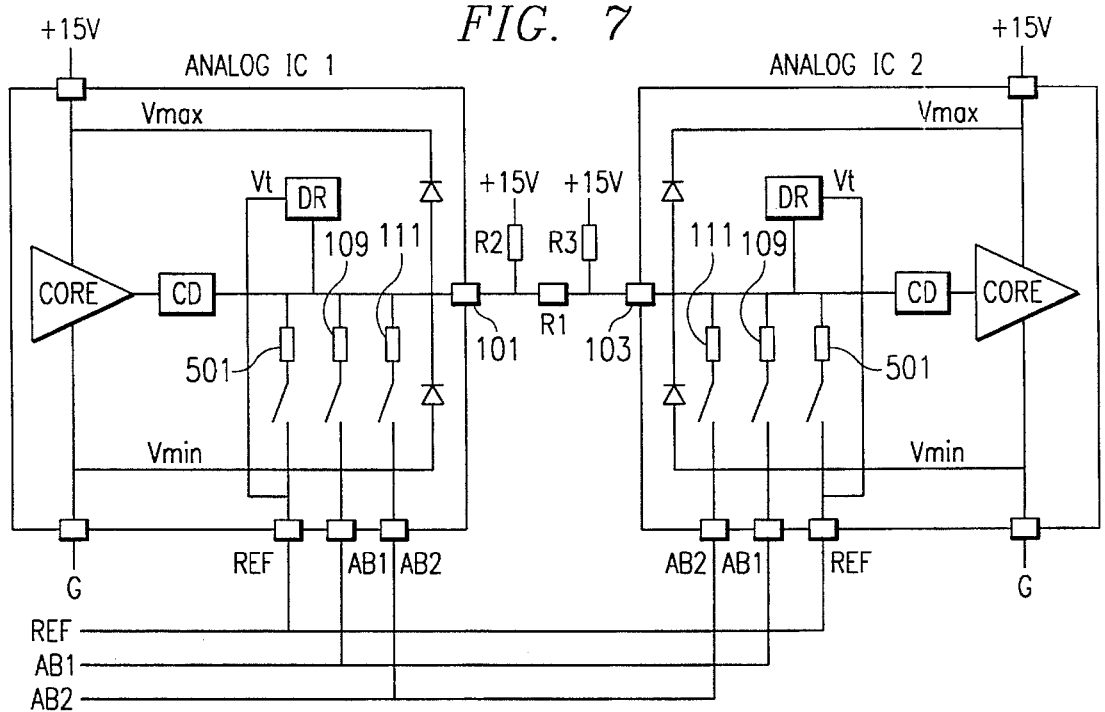

In exemplary FIG. 7, IC1 and IC2 are both supplied by +15 volt and G, and their pins are connected via the same resistive interconnect described in FIG. 4, with R2=R3 and R1=2R2. The resistive interconnect provides a voltage divider between the pins of IC1 and IC2. During digital test mode, the AB1 and AB2 pins supply the voltage levels to be transferred between IC1 and IC2 through the resistive interconnect, and the REF pin supplies the Vt level for the DR. If the AB1 and AB2 pins of IC1 are respectively supplied with +15 volts and G and the AB1 and AB2 switches 109 and 111 are operated to produce +15 and G voltage swings from IC1, the resistive interconnect will produce +15 volt and +10 volt (15 V×(⅔)) swings at the input pin 103 of IC2, due to the voltage division of R1 and R3. Since Vt must be set to recognize a logic one (+15 v) from a logic zero (+10 v) at the input 103 of IC2, a voltage of say +12.5 v is supplied to the REF pins of IC1 and IC2.

These examples of FIGS. 6–7 illustrate the ability to externally set the value of Vt via the REF pin, and cell connection between the REF pin and the DR, to allow the new cell according to the invention to overcome the logic level recognition problem described in the prior art cell.

Also in the cells of FIGS. 5–7, a scan-operable guard switch 501 is provided to selectively connect the REF pin to the IC pin (101 or 103), thereby permitting the REF voltage to be used in place of the Vmax/Vmin voltages when performing the guarding techniques described above.

Figure 1:
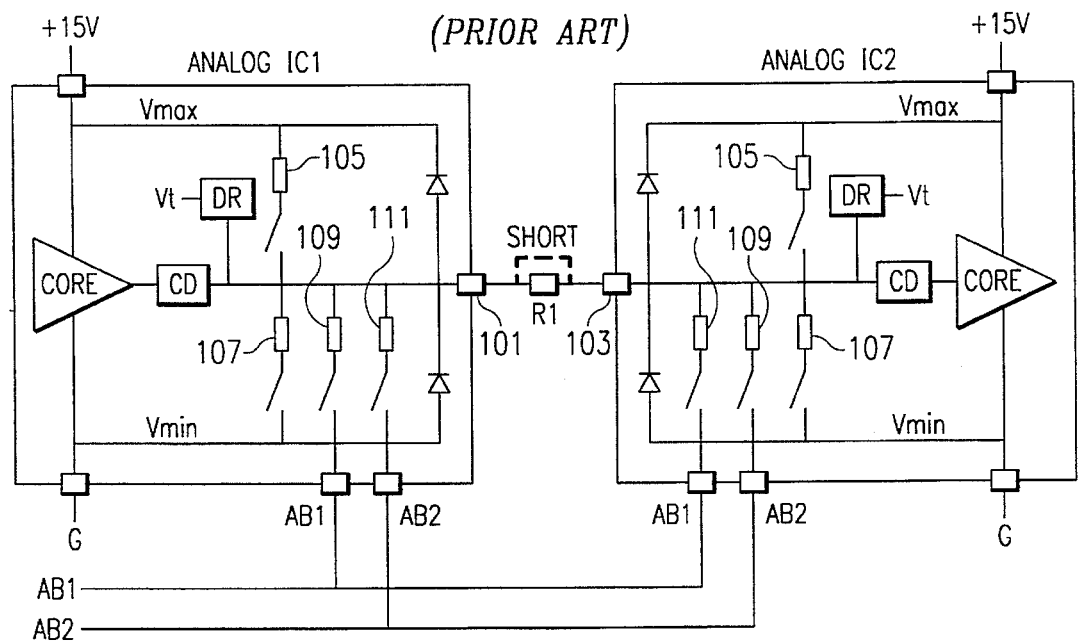
FIG. 1 illustrates the structure and operation of prior art and analog test cells.
Figure 8:
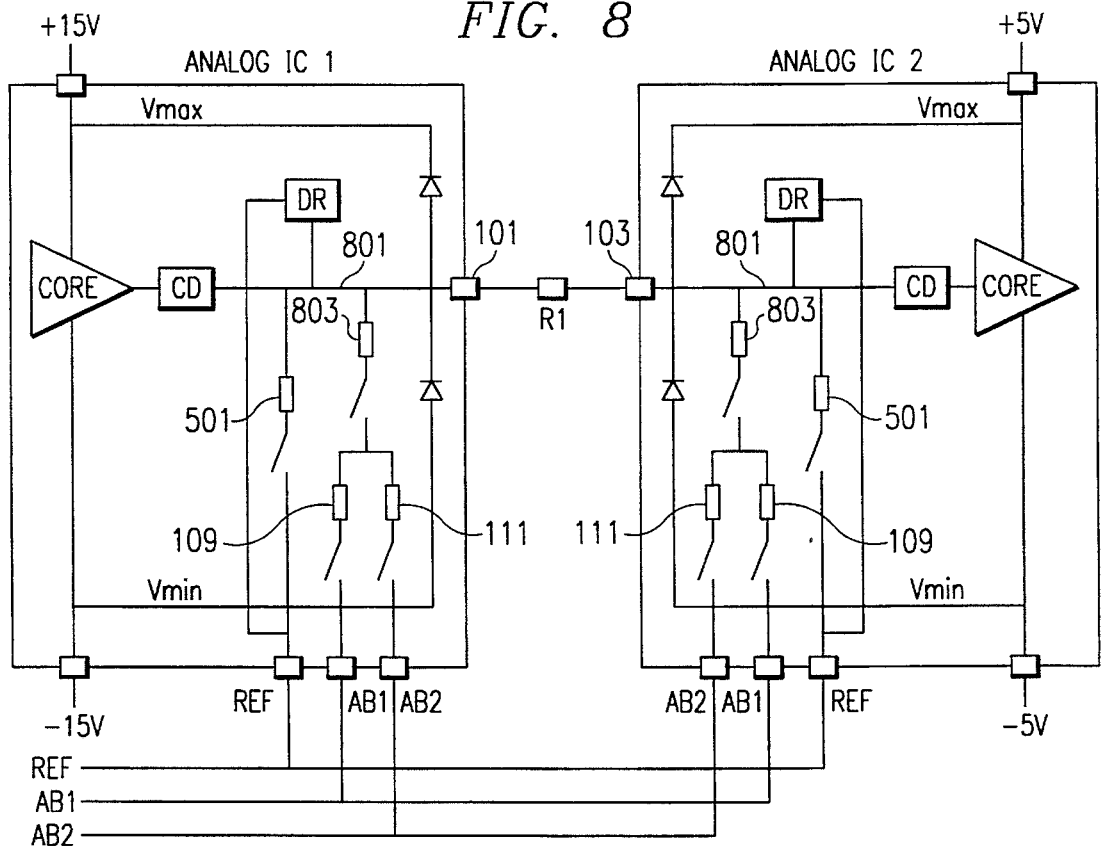
FIG. 8 illustrates an alternative analog test cell embodiment which minimizes the loading effect that the analog test cells impose upon the normal signal paths of the system under test.

The cell design of FIG. 8 provides a way to reduce the load effect of the switches on the analog signal line 801. During normal (non-test) operation, line 801 sees two switches, 501 and 803, as compared to four in the prior art cell of FIG. 1 and three in the cell of FIG. 5. The guard switch 501 is advantageously connected to line 801 to allow measurement of interconnect impedances as described above. If the guard switch 501 was connected to the scan-operable isolation switch 803 (i.e. the switch coupled between the line 801 and the AB1 and AB2 switches 109 and 111) as are the AB1 and AB2 switches 109 and 111, the unknown voltage drop across the isolation switch 803 would prevent accurate performance of the interconnect impedance measurements (i.e. the guarding techniques) previously described.

Figure 9:
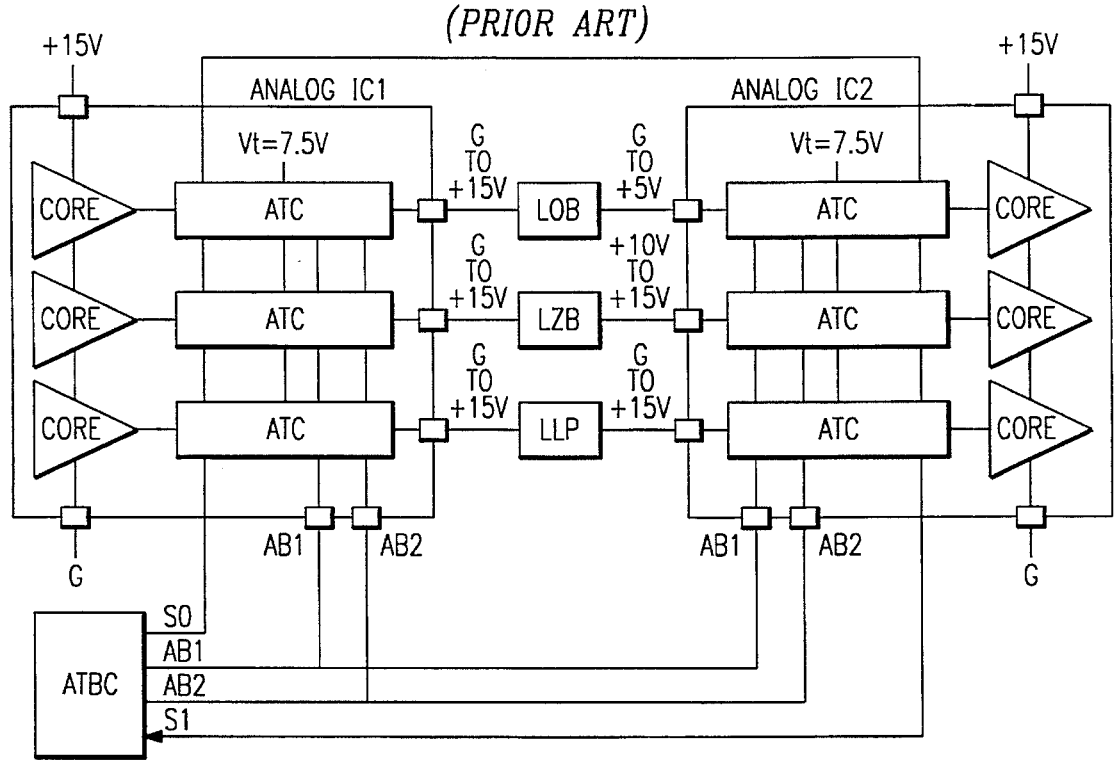
FIG. 9 illustrates a prior art testing arrangement and procedure for testing interconnections between analog or mixed signal integrated circuits.

In FIG. 9, an example is shown of the prior art analog test cells (ATC) of two ICs being controlled by an external analog test bus controller (ATBC). The ATBC could be an external tester or an IC. The ATBC has scan out (SO) and scan in (SI) signals used to scan data into the ICs to operate (open or close) the switches of the ATCs during digital or analog test modes. The ATBC also has analog signals for transmitting and receiving voltages or currents to and from the AB1 and AB2 pins of the ICs.

Figure 2:
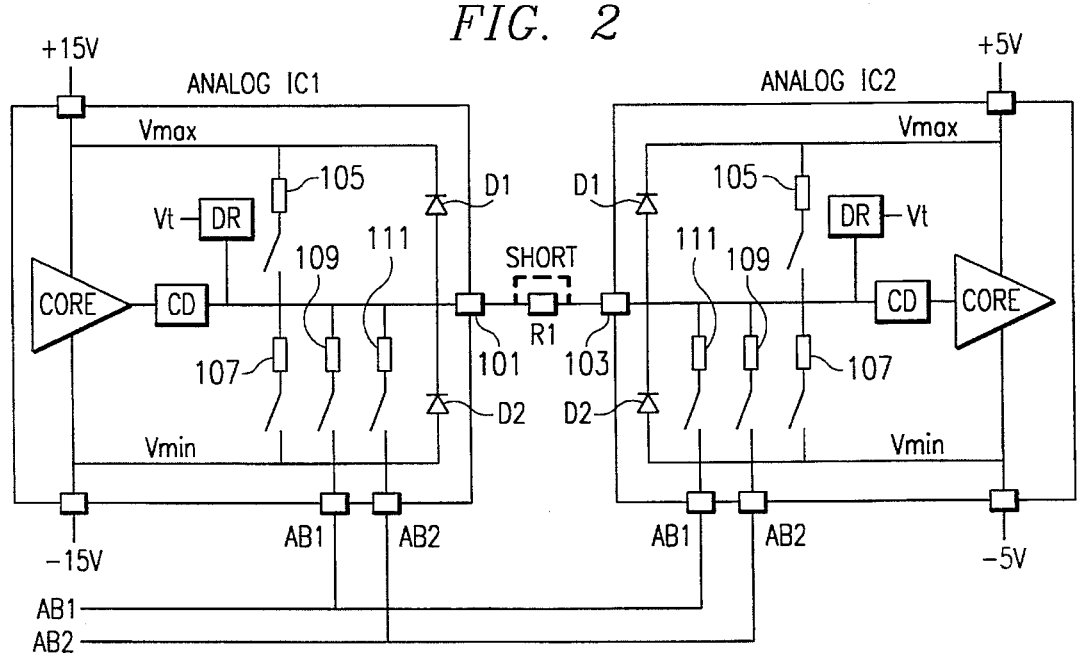
FIGS. 2–4 illustrate arrangements wherein the prior art analog test cells of FIG. 1 encounter operational problems.

When the ATCs of IC1 and IC2 in FIG. 9 are placed in digital test mode, the ATBC scans data into the ICs to operate the ATC switches to pass logic levels from IC1 to IC2, to test the interconnects. Three types of interconnects exist between IC1 and IC2; a logic one blocker (LOB) interconnect, a logic zero blocker (LZB) interconnect, and a logic level passer (LLP) interconnect. The LOB could be the interconnect shown in FIGS. 3 and 6. The LZB could be the interconnect shown in FIGS. 4 and 7. The LLP could be the interconnect shown in FIGS. 1, 2, and 5. As shown in FIG. 9, when IC1 outputs G and +15 volt swings to the LOB, LZB and LLP interconnects, the outputs of the interconnects differ in voltage swing. LOB outputs G and +5 volt swings, LZB outputs +10 and +15 volt swings, and LLP outputs G and +15 volt swings. Only the LLP interconnect successfully outputs voltage swings that are recognized by IC2 as logic one and zero indications. The reason for this has been previously described and is because of the internally fixed Vt of IC2 (7.5 v). So using the prior art ATCs, only LLP type interconnects can be tested in parallel using the digital test mode. The other interconnects must be tested individually by using the analog test mode. During the analog test mode, the ATBC scans IC1 and IC2 to close switches on a selected interconnect, then outputs a voltage or current on say AB1 that will traverse the interconnect and be returned to the ATBC via AB2. The analog test mode is effective on all types of interconnects, but it takes more time than the digital test mode since each interconnect must be tested one at a time in the analog test mode, whereas the digital test mode tests all interconnects in parallel and scans out the results from the DRs to the ATBC via the SI input of the ATBC.

Figure 10:
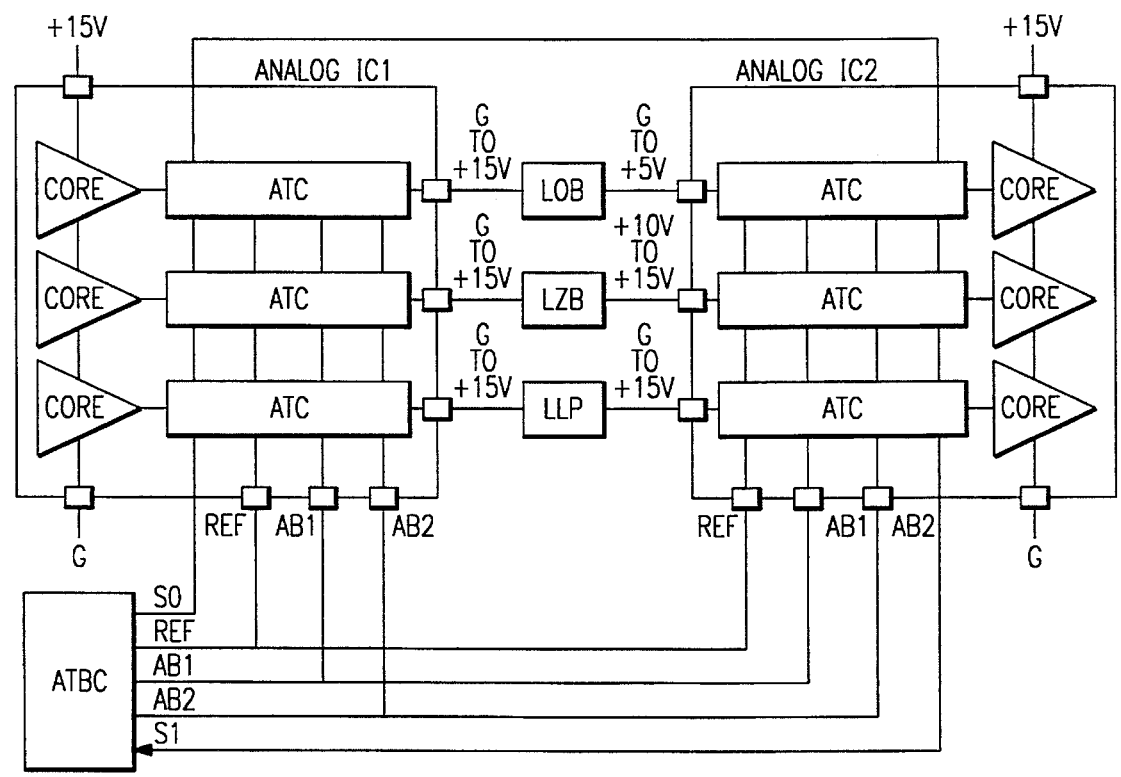
FIG. 10 illustrates a testing arrangement and procedure according to the present invention for testing interconnections between analog or mixed signal integrated circuits.
Figure 11:
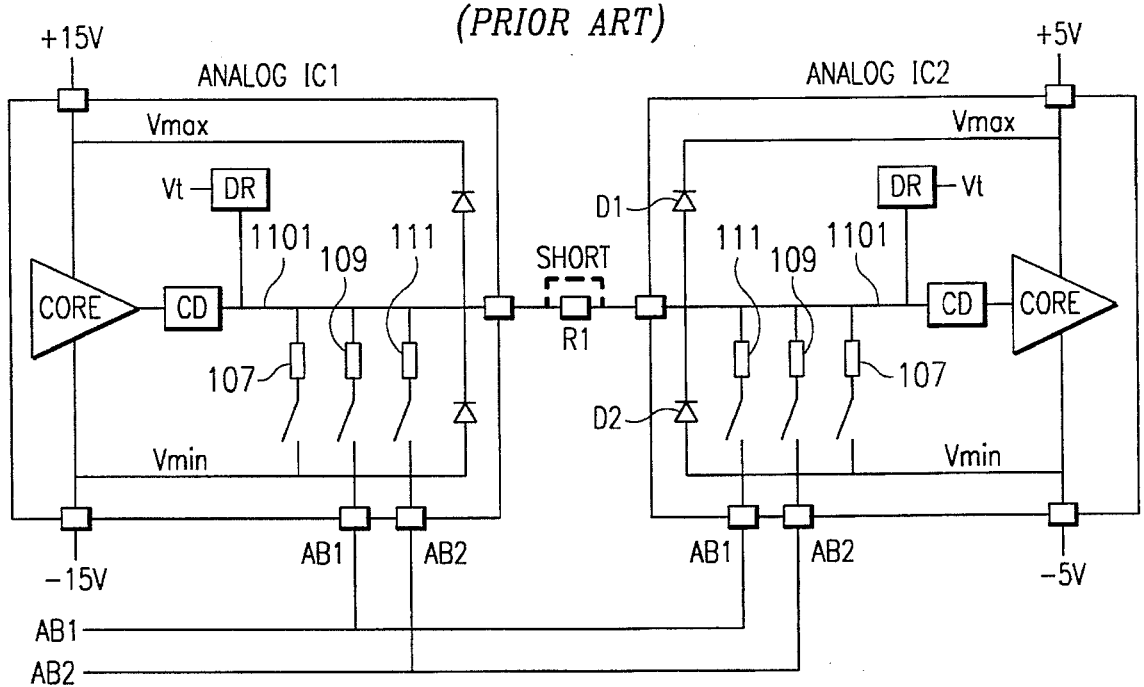
FIG. 11 illustrates a prior art analog test cell with reduced size and loading features.

In the system example of FIG. 10 the new ATCs of the present invention are used in IC1 and IC2. Note that the ICs include the additional REF pin and that the ATBC includes an additional signal to supply a reference voltage to the REF pin. The digital interconnect testing of IC1 and IC2 occurs in two steps. In the first step, the ATBC outputs a reference voltage of +2.5 volts to the REF pins of IC1 and IC2, which then becomes the Vt for the DRs of the ATCs. Following this setup procedure, the ATCs of IC1 are operated by the ATBC to output G and +15 volt swings to the interconnects, while the ATCs of IC2 are operated to receive the voltage swing outputs from the interconnects. The ATCs of IC2 connected to the LOB and LLP interconnects recognize the received voltage swings since the Vt is set at +2.5 volts, a voltage within the range of both LOB and LLP output voltage swings. So the first step successfully tests in parallel all the LOB and LLP type interconnects. The second step is to test the remaining LZB type interconnects. This is accomplished by having the ATBC output a reference voltage of +12.5 volts to the IC1 and IC2 REF pins. Following this setup procedure, the ATCs of IC1 are again operated by the ATBC to output G and +15 volt swings to the interconnects, while the ATCs of IC2 are operated to receive the voltage swing outputs from the interconnects. The ATCs of IC2 connected to the LZB and LLP interconnects recognize the received voltage swings since their Vt is set at +12.5 volts, a voltage in the range of the LZB and LLP voltage swings. Note that the LLP interconnects are tested twice since their output voltage swings cross both the +2.5 and +12.5 volt references.

From this system operation description, it is seen that the new analog test cell architecture provides a way to overcome the digital test mode limitations of the prior art analog test cell. Interconnects that are not always reliably tested with the prior art cell are rendered reliably testable using the new cell. The key feature that makes this possible is the ability to adjust the Vt so that it can recognize different levels of voltage swing at IC pins. The ability to adjust Vt for testing different interconnect group types, forms the basis of a fundamental test procedure for the digital test mode. This fundamental digital test mode procedure, made possible by the new analog cell design, is described below.

Analysis Phase:
1. Classify and group circuit interconnect types (i.e. LLP, LOB, LZB, other)
2. Determine Vt levels required for digital testing of each interconnect group Execution Phase:
1. Establish Vt for a first interconnect group
2. Operate in digital test mode to test first interconnect group
3. Repeat 1 and 2 for each additional interconnect group to be tested
4. End of Test Although exemplary embodiments of the present invention are described above, this description does not limit the scope of the invention, which can be practiced in a variety of embodiments.

What is claimed is:

1. A method of evaluating an interconnect structure which carries an analog signal between a first external terminal of a first integrated circuit and a second external terminal of a second integrated circuit, comprising the steps of:

selecting a test stimulus to be applied to the first terminal;

analyzing the interconnect structure to determine an expected voltage that is expected to be produced at the second terminal in response to application of the test stimulus to the first terminal;

selecting a reference voltage which bears a desired relationship to the expected voltage, producing the reference voltage independently of the second integrated circuit, and providing the reference voltage at a reference node in the second integrated circuit;

applying the test stimulus to the first terminal to produce a response voltage at the second terminal; and comparing the response voltage to the reference voltage.

2. A method of evaluating interconnect structures which carry analog signals between first and second integrated circuits, comprising the steps of:

selecting for evaluation a first interconnect structure connected between a first external terminal of the first integrated circuit and a second external terminal of the second integrated circuit;

producing a first reference voltage independently of the second integratated circuit;

providing the first reference voltage at a reference node in the second integrated circuit;

providing a first test voltage at the second terminal by applying a test stimulus to the first terminal;

comparing the first test voltage to the first reference voltage;

selecting for evaluation a second interconnect structure connected between a third external terminal of the first integrated circuit and a fourth external terminal of the second integrated circuit;

producing a second reference voltage independently of the second integrated circuit;

providing the second reference voltage at the reference node;

providing a second test voltage at the fourth terminal by applying a test stimulus to the third terminal; and comparing the second test voltage to the second reference voltage.

3. The method of claim 2, wherein the step of providing the second reference voltage includes applying the second reference voltage to an external terminal of the second integrated circuit.

4. The method of claim 2, wherein the step of producing the second reference voltage includes determining an expected voltage that is expected to be produced at the fourth terminal in response to application of the test stimulus to the third terminal, and wherein the step of producing the second reference voltage includes selecting the second reference voltage as a function of the expected voltage.

5. A method of evaluating interconnect structures which carry analog signals between first and second integrated circuits, comprising the steps of:

selecting for evaluation an interconnect structure connected between a first external terminal of the first integrated circuit and a second external terminal of the second integrated circuit;

producing a reference voltage independently of the second integrated circuit;

providing the reference voltage at a reference node in the second integrated circuit;

providing a test voltage at the second terminal by applying a test stimulus to the first terminal; and comparing the reference voltage to the test voltage.

* * * * *